US011885852B2

(12) United States Patent
Takai

(10) Patent No.: US 11,885,852 B2
(45) Date of Patent: Jan. 30, 2024

(54) BATTERY MANAGEMENT DEVICE, ENERGY STORAGE APPARATUS, BATTERY MANAGEMENT METHOD, AND COMPUTER PROGRAM

(71) Applicant: GS Yuasa International Ltd., Kyoto (JP)

(72) Inventor: Seiji Takai, Kyoto (JP)

(73) Assignee: GS YUASA INTERNATIONAL LTD., Kyoto (JP)

( * ) Notice: Subject to any disclaimer, the term of this patent is extended or adjusted under 35 U.S.C. 154(b) by 217 days.

(21) Appl. No.: 17/442,761

(22) PCT Filed: Mar. 24, 2020

(86) PCT No.: PCT/JP2020/012814
§ 371 (c)(1),
(2) Date: Sep. 24, 2021

(87) PCT Pub. No.: WO2020/196438
PCT Pub. Date: Oct. 1, 2020

(65) Prior Publication Data
US 2022/0170990 A1    Jun. 2, 2022

(30) Foreign Application Priority Data

Mar. 27, 2019 (JP) ................................ 2019-061521

(51) Int. Cl.
*G01R 31/387* (2019.01)
*G01R 1/20* (2006.01)
(Continued)

(52) U.S. Cl.
CPC ........... *G01R 31/387* (2019.01); *G01R 1/203* (2013.01); *H01M 10/425* (2013.01);
(Continued)

(58) Field of Classification Search
None
See application file for complete search history.

(56) References Cited

U.S. PATENT DOCUMENTS 6,208,117 B1    3/2001  Hibi
10,802,049 B2 * 10/2020  Park ................. H01M 10/4285
(Continued)

FOREIGN PATENT DOCUMENTS

JP    2000-304800 A    11/2000
JP    2001-045670 A    2/2001
(Continued)

OTHER PUBLICATIONS

International Search Report (ISR) (PCT Form PCT/ISA/210), in PCT/JP2020/012814, dated Jun. 23, 2020.

*Primary Examiner* — Roy Y Yi
(74) *Attorney, Agent, or Firm* — MCGINN I.P. LAW GROUP, PLLC

(57) ABSTRACT

A battery management device manages an energy storage device to which a shunt resistor is connected. The battery management device includes: a current measurement unit that measures a current flowing through the shunt resistor using a pair of signal wires connected to both ends of the shunt resistor; a connecting wire that connects the signal wire to a reference potential source via an opening/closing switch; and a determination unit that determines presence or absence of a failure in which connection between the pair of signal wires via the shunt resistor becomes defective based on a change in current measured by the current measurement unit when the opening/closing switch is opened and closed.

10 Claims, 7 Drawing Sheets

(51) Int. Cl.
  *H01M 10/42* (2006.01)
  *H01M 10/48* (2006.01)
  *H02H 7/18* (2006.01)
  *G01R 31/378* (2019.01)

(52) U.S. Cl.
  CPC .............. *H01M 10/48* (2013.01); *H02H 7/18* (2013.01); *G01R 31/378* (2019.01); *H01M 2010/4271* (2013.01); *H01M 2220/20* (2013.01)

(56) References Cited

U.S. PATENT DOCUMENTS

| | | | |
|---|---|---|---|
| 2009/0132188 A1 | 5/2009 | Watanabe | |
| 2011/0057658 A1 | 3/2011 | Yugou et al. | |
| 2015/0323608 A1* | 11/2015 | Jung | ................... G06F 11/30 702/58 |
| 2016/0336626 A1 | 11/2016 | Kawauchi et al. | |
| 2018/0062371 A1 | 3/2018 | Imura | |

FOREIGN PATENT DOCUMENTS

| | | |
|---|---|---|
| JP | 2001-108645 A | 4/2001 |
| JP | 2008-275323 A | 11/2008 |
| JP | 2009-122056 A | 6/2009 |
| JP | 2009-139223 A | 6/2009 |
| JP | 2011-033632 A | 2/2011 |
| JP | 2011-058851 A | 3/2011 |
| JP | 2017-005985 A | 1/2017 |
| JP | 2018-031778 A | 3/2018 |
| WO | WO 2015/145496 A1 | 10/2015 |

* cited by examiner

BATTERY MANAGEMENT DEVICE, ENERGY STORAGE APPARATUS, BATTERY MANAGEMENT METHOD, AND COMPUTER PROGRAM

TECHNICAL FIELD

The present invention relates to a battery management device, an energy storage apparatus, a battery management method, and a computer program.

BACKGROUND ART

An energy storage apparatus such as a lithium ion battery is provided with a battery management device (BMU: Battery Management Unit) for preventing overcharge, overdischarge, and the like. The battery management device includes a current measurement unit that measures a current flowing through an energy storage device included in the energy storage apparatus. The current measurement unit measures a current flowing through a shunt resistor connected to the energy storage device. The battery management device measures a voltage, a current, and a temperature of the energy storage device, and breaks the current flowing through the energy storage device when an abnormality is detected, thereby preventing the energy storage device from being in an abnormal state. The battery management device can estimate a state of charge (SOC) of the energy storage device by measuring a charge-discharge current of the energy storage device and integrating a current value. Patent Document 1 discloses an example of a battery management device.

PRIOR ART DOCUMENT

Patent Document

Patent Document 1: JP-A-2018-31778

SUMMARY OF THE INVENTION

Problems to be Solved by the Invention

In an energy storage apparatus, current measurement may not be normally performed due to a failure such that a shunt resistor is disconnected from a circuit or a signal wire connected to the shunt resistor for measuring a current comes down. When the current measurement cannot be performed normally, the battery management device cannot properly manage the energy storage device. Therefore, a technique for easily determining the presence or absence of these failures is required.

An object of the present invention is to provide a battery management device, an energy storage apparatus, a battery management method, and a computer program capable of easily determining the presence or absence of a failure that causes current measurement to fail normally.

Means for Solving the Problems

A battery management device according to one aspect of the present invention manages an energy storage device to which a shunt resistor is connected. The battery management device includes: a current measurement unit that measures a current flowing through the shunt resistor using a pair of signal wires connected to both ends of the shunt resistor; a connecting wire that connects the signal wire to a reference potential source via an opening/closing switch; and a determination unit that determines presence or absence of a failure in which connection between the pair of signal wires via the shunt resistor becomes defective based on a change in current measured by the current measurement unit when the opening/closing switch is opened and closed.

An energy storage apparatus according to another aspect of the present invention includes: an energy storage device; a shunt resistor connected to the energy storage device; and a battery management device that manages the energy storage device. The battery management device includes: a current measurement unit that measures a current flowing through the shunt resistor using a pair of signal wires connected to both ends of the shunt resistor; a connecting wire that connects the signal wire to a reference potential source via an opening/closing switch; and a determination unit that determines presence or absence of a failure in which connection between the pair of signal wires via the shunt resistor becomes defective based on a change in current measured by the current measurement unit when the opening/closing switch is opened and closed.

A battery management method according to another aspect of the present invention manages an energy storage device to which a shunt resistor is connected. The battery management method includes determining, using a current measurement unit that measures a current flowing through the shunt resistor using a pair of signal wires connected to both ends of the shunt resistor, and a connecting wire that connects the signal wire to a reference potential source via an opening/closing switch, presence or absence of a failure in which connection between the pair of signal wires via the shunt resistor becomes defective based on a change in current measured by the current measurement unit when the opening/closing switch is opened and closed.

A computer program according to another aspect of the present invention causes a computer to execute a process for managing an energy storage device using a current measurement unit that measures a current flowing through the shunt resistor using a pair of signal wires connected to both ends of the shunt resistor connected to the energy storage device, and a connecting wire that connects the signal wire to a reference potential source via an opening/closing switch. The computer program causes the computer to execute: a step of opening and closing the opening/closing switch; and a step of determining presence or absence of a failure in which connection between the pair of signal wires via the shunt resistor becomes defective based on a change in current measured by the current measurement unit when the opening/closing switch is opened and closed.

Advantages of the Invention

With the above configuration, the battery management device can easily determine the presence or absence of a failure that causes the current measurement to fail normally for the energy storage apparatus.

MODE FOR CARRYING OUT THE INVENTION

Figure 1:
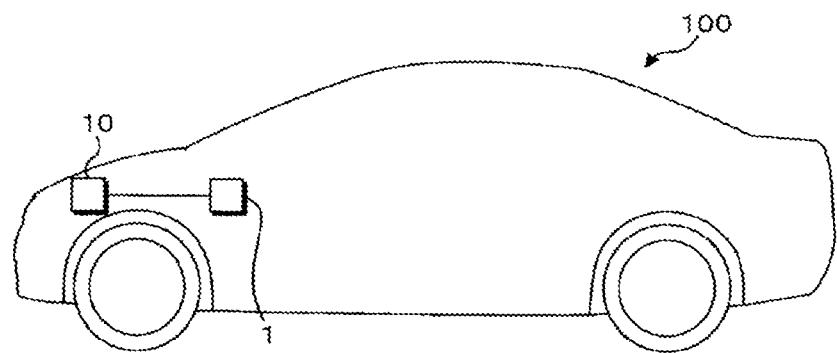
FIG. 1 is a conceptual view illustrating an arrangement example of an energy storage apparatus.

Provided is a battery management device that manages an energy storage device to which a shunt resistor is connected, the battery management device including: a current measurement unit that measures a current flowing through the shunt resistor using a pair of signal wires connected to both ends of the shunt resistor; a connecting wire that connects the signal wire to a reference potential source via an opening/closing switch; and a determination unit that determines presence or absence of a failure in which connection between the pair of signal wires via the shunt resistor becomes defective based on a change in current measured by the current measurement unit when the opening/closing switch is opened and closed. A change in current when the opening/closing switch is opened and closed is different between a state where there is a failure in which the connection between the pair of signal wires via the shunt resistor is defective and a state where there is no failure. The battery management device can determine the presence or absence of a failure based on the change in current when the opening/closing switch is opened and closed.

Conventionally, a battery management device measures a current flowing through a shunt resistor and performs a process for managing an energy storage device based on a current value. When a failure occurs in which the connection between the pair of signal wires via the shunt resistor becomes defective, such as when the shunt resistor is disconnected from the battery management device, the battery management device cannot perform an appropriate process based on the current value. In the present embodiment, since the change in current when the opening/closing switch is opened and closed is clearly different depending on the presence or absence of a failure, the battery management device can determine the presence or absence of a failure in a short time as compared with the case of determining the presence or absence of a failure from the change in time of the current. Since the presence or absence of a failure can be determined in a short time, the battery management device can stop the process based on the incorrect current value caused by the failure in a short time, and reduce the influence of the incorrect current value being measured.

The battery management device may further include a first opening/closing unit that periodically opens and closes the opening/closing switch. By periodically determining the presence or absence of a connection failure of a signal wire, the battery management device can determine occurrence of a failure.

The battery management device may further include a second opening/closing unit that opens and closes the opening/closing switch when a value of the current measured by the current measurement unit is included in a predetermined range. In a state where there is a failure in which the connection between the pair of signal wires via the shunt resistor becomes defective, the current value is higher than that in a case where there is no failure. Therefore, when the current value is included in a predetermined range that is a value higher than usual, there is a high possibility that a failure has occurred. The battery management device makes a determination when the current value is included in the predetermined range that is a value higher than usual. Since the battery management device makes a determination when there is a high possibility that a failure has occurred, the occurrence of a failure can be determined with high accuracy.

The reference potential source may be a ground, the current measurement unit may measure a voltage between the pair of signal wires and measure a current based on the voltage, the pair of connecting wires may be connected to the pair of signal wires via a resistor having a resistance higher than a resistance of the shunt resistor, and the determination unit may determine that the failure has occurred when a current measured by the current measurement unit approaches 0 in a state where the opening/closing switch is closed as compared with a current measured by the current measurement unit in a state where the opening/closing switch is open. In a state where a failure has not occurred, when the opening/closing switch is closed, the signal wire is hardly affected by the ground connected via the resistor. The current value measured by the current measurement unit is substantially the same between a case where the opening/closing switch is open and a case where the opening/closing switch is closed. In a state where a failure occurs, when the opening/closing switch is open, the signal wire is in a high impedance state, and the current measurement unit measures a high current value. When the opening/closing switch is closed, the signal wire is connected to the ground, and the current measurement unit measures a current value of substantially 0. Therefore, the battery management device can determine that a failure has occurred when the current value when the opening/closing switch is closed changes so as to approach 0 as compared with the current value when the opening/closing switch is open.

The battery management device may further include: an overcurrent detection unit that detects an overcurrent flowing through the shunt resistor; and a breaking processing unit that performs a process for breaking the current flowing through the shunt resistor when the overcurrent is detected, and the determination unit may determine the presence or absence of the failure before the breaking processing unit performs the process. In the present embodiment, since the change in current when the opening/closing switch is opened and closed is clearly different depending on the presence or absence of a failure, the battery management device can determine the presence or absence of a failure in a short time as compared with the case of detecting the change of the current flowing through the shunt resistor to the overcurrent due to the failure. Therefore, the battery management device can determine the presence or absence of a failure before breaking the current in response to the detection of the overcurrent. The battery management device can stop the process based on the incorrect current value caused by the failure before the current is broken, and reduce the influence of the incorrect current value being measured.

An energy storage apparatus includes: an energy storage device; a shunt resistor connected to the energy storage device; and a battery management device that manages the energy storage device. The battery management device includes: a current measurement unit that measures a current flowing through the shunt resistor using a pair of signal wires connected to both ends of the shunt resistor; a connecting wire that connects the signal wire to a reference potential source via an opening/closing switch; and a determination unit that determines presence or absence of a failure in which connection between the pair of signal wires via the shunt resistor becomes defective based on a change in current measured by the current measurement unit when the opening/closing switch is opened and closed. A change in current when the opening/closing switch is opened and closed is different between a state where there is a failure in which the connection between the pair of signal wires via the shunt resistor is defective and a state where there is no failure. The battery management device can determine the presence or absence of a failure based on the change in current when the opening/closing switch is opened and closed.

The energy storage device may be a lithium ion battery containing lithium iron phosphate in an electrode. In the iron-based lithium ion battery, it is necessary to calculate the SOC based on the current value in order to obtain the SOC. When the incorrect current value is measured due to the failure, the battery management device can determine the occurrence of the failure in a short time and quickly stop the calculation of the SOC using the incorrect current value. Therefore, the battery management device can more accurately calculate the SOC of the energy storage device based on the current value. Even when the energy storage device is a cell of an iron-based lithium ion battery, an accurate SOC can be obtained.

The energy storage device may supply a current for starting an engine of a moving body. The energy storage apparatus for starting the engine can supply a large current. In order to measure a large current by the battery management device, it is necessary to use the shunt resistor having a low resistance. The shunt resistor having a low resistance may be large and heavy. The energy storage apparatus is provided in a moving body, and when vibration is applied to the heavy shunt resistor included in the energy storage apparatus, stress applied to a portion where the shunt resistor is fixed increases, and the shunt resistor may be disconnected. Since the battery management device can determine disconnection of the shunt resistor, it is possible to appropriately diagnose the failure of the energy storage apparatus to which the shunt resistor can be disconnected.

The moving body may be a four-wheeled automobile. A large amount of electric power is required to start the engine of the four-wheeled automobile, and the energy storage apparatus needs to supply a large current. In order to measure a large current with the battery management device, the shunt resistor may be large and heavy. When vibration is applied to the battery management device provided in the four-wheeled automobile, stress applied to a portion where the shunt resistor is fixed increases, and the shunt resistor may be disconnected. The battery management device can appropriately diagnose the failure of the energy storage apparatus by determining the disconnection of the shunt resistor.

Provided is a battery management method for managing an energy storage device to which a shunt resistor is connected, the battery management method including determining, using a current measurement unit that measures a current flowing through the shunt resistor using a pair of signal wires connected to both ends of the shunt resistor, and a connecting wire that connects the signal wire to a reference potential source via an opening/closing switch, presence or absence of a failure in which connection between the pair of signal wires via the shunt resistor becomes defective based on a change in current measured by the current measurement unit when the opening/closing switch is opened and closed. A change in current when the opening/closing switch is opened and closed is different between a state where there is a failure in which the connection between the pair of signal wires via the shunt resistor is defective and a state where there is no failure. The presence or absence of a failure can be determined based on a change in current when the opening/closing switch is opened and closed.

Provided is a computer program that causes a computer to execute a process for managing an energy storage device using a current measurement unit that measures a current flowing through the shunt resistor using a pair of signal wires connected to both ends of the shunt resistor connected to the energy storage device, and a connecting wire that connects the signal wire to a reference potential source via an opening/closing switch, in which the computer program causes the computer to execute: a step of opening and closing the opening/closing switch; and a step of determining presence or absence of a failure in which connection between the pair of signal wires via the shunt resistor becomes defective based on a change in current measured by the current measurement unit when the opening/closing switch is opened and closed. A change in current when the opening/closing switch is opened and closed is different between a state where there is a failure in which the connection between the pair of signal wires via the shunt resistor is defective and a state where there is no failure. The presence or absence of a failure can be determined based on a change in current when the opening/closing switch is opened and closed.

Hereinafter, the present invention will be specifically described with reference to the drawings illustrating embodiments thereof.

First Embodiment

FIG. 1 is a conceptual view illustrating an arrangement example of an energy storage apparatus 1. The energy storage apparatus 1 is provided in a moving body 100. The energy storage apparatus 1 is connected to an engine 10 included in the moving body 100. The moving body 100 is a four-wheeled automobile. The energy storage apparatus 1 supplies a current for starting the engine 10.

Figure 2:
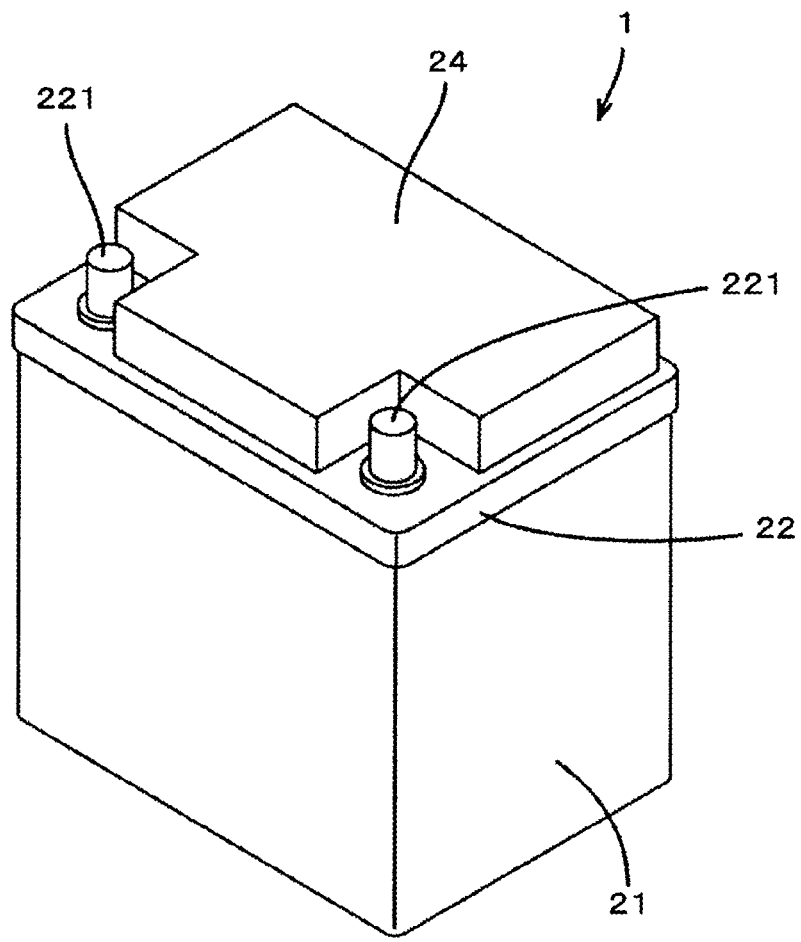
FIG. 2 is a schematic perspective view illustrating an example of an external appearance of the energy storage apparatus.
Figure 3:
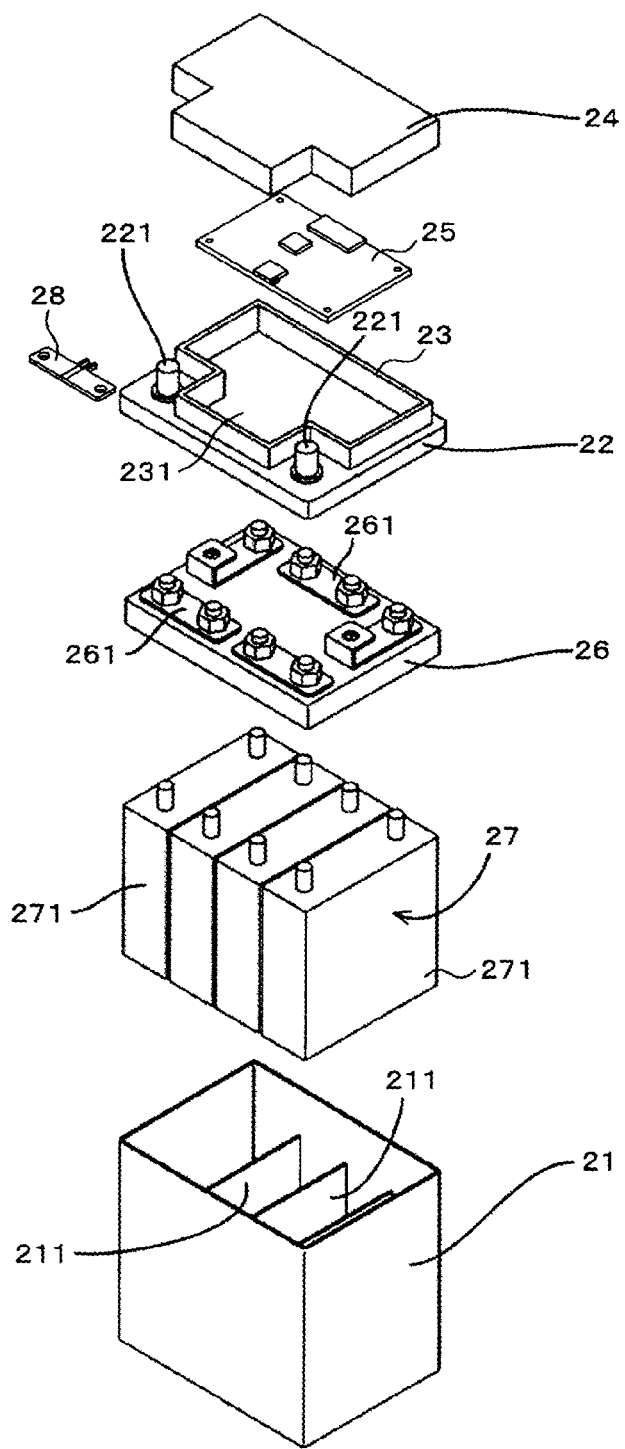
FIG. 3 is a schematic exploded perspective view illustrating a configuration example of the energy storage apparatus.

FIG. 2 is a schematic perspective view illustrating an example of an external appearance of the energy storage apparatus 1. The energy storage apparatus 1 includes a rectangular parallelepiped case 21 and a lid portion 22 that closes an opening portion of the case 21. FIG. 3 is a schematic exploded perspective view illustrating a configuration example of the energy storage apparatus 1. The case 21 accommodates a battery unit 27 including a plurality of energy storage devices 271. The energy storage device 271 is, for example, a cell of an iron-based lithium ion battery. The iron-based lithium ion battery contains lithium iron phosphate in an electrode. The energy storage device 271 may be a cell of a lithium ion battery other than the iron-based lithium ion battery, or may be a cell of a battery other than the lithium ion battery.

Partition plates 211 are provided in the case 21. The energy storage device 271 is inserted between the respective partition plates 211. An inner lid 26 is disposed between the lid portion 22 and the energy storage devices 271. A plurality of metal bus bars 261 are placed on the inner lid 26. The inner lid 26 is disposed on terminal surfaces on which terminals of the energy storage devices 271 are provided, the adjacent terminals of the adjacent energy storage devices 271 are connected by the bus bar 261, and the energy storage devices 271 are connected in series.

An accommodating portion 23 is provided on the lid portion 22, and the accommodating portion 23 is covered with a cover 24. The accommodating portion 23 has a box shape, and has a protruding portion 231 protruding outward in a prismatic shape at a central portion of one long side surface. A pair of external terminals 221, 221 made of metal such as a lead alloy and having different polarities are provided on both sides of the protruding portion 231 in the lid portion 22. The external terminals 221, 221 are terminals for connecting to the outside of the energy storage apparatus 1. A control board 25 and a shunt resistor 28 are accommodated in the accommodating portion 23. The control board 25 includes a battery management device that manages the energy storage devices 271. The control board 25 and the shunt resistor 28 are accommodated in the accommodating portion 23, and the accommodating portion 23 is covered with the cover 24, whereby the battery unit 27, and the control board 25 and the shunt resistor 28 are connected.

Figure 4:
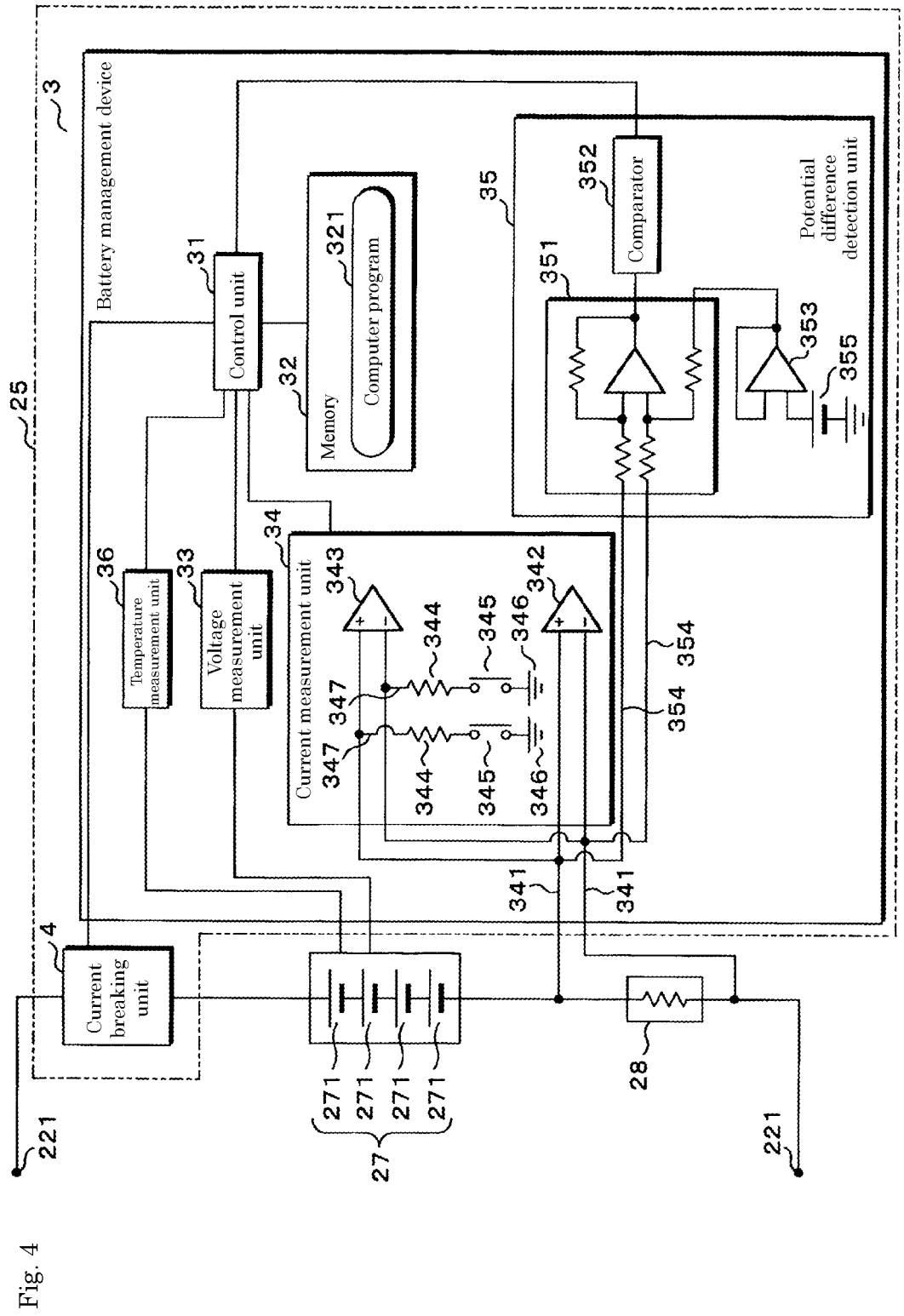
FIG. 4 is a block diagram illustrating an electrical configuration example of the energy storage apparatus according to the first embodiment.

FIG. 4 is a block diagram illustrating an electrical configuration example of the energy storage apparatus 1 according to the first embodiment. The control board 25 includes a battery management device 3 and a current breaking unit 4. The battery management device 3 executes a battery management method. The current breaking unit 4, the battery unit 27, and the shunt resistor 28 are connected in series between the pair of external terminals 221, 221. The battery unit 27 includes the plurality of energy storage devices 271. The number of the energy storage devices 271 is not limited to four. When each energy storage device 271 is discharged, electric power is output from the external terminals 221, 221. When a voltage is applied between the external terminals 221, 221 from the outside, the plurality of energy storage devices 271 are charged. A current when the energy storage device 271 performs charge-discharge flows through the shunt resistor 28. The current breaking unit 4 breaks a current as necessary to stop charge-discharge of the energy storage device 271. The current breaking unit 4 includes, for example, a relay.

The battery management device 3 includes a control unit 31. The control unit 31 is configured using a processor and a memory. For example, the control unit 31 is configured using a central processing unit (CPU). The control unit 31 controls each part of the battery management device 3. A non-volatile memory 32 is connected to the control unit 31. The memory 32 stores a computer program 321. The control unit 31 is a computer that executes a necessary process according to the computer program 321. The control unit 31 is connected to the current breaking unit 4 and controls the operation of the current breaking unit 4.

The battery management device 3 includes a voltage measurement unit 33. The voltage measurement unit 33 is connected to the battery unit 27 and measures the voltage of each energy storage device 271. The voltage measurement unit 33 is connected to the control unit 31, and inputs the measured value of the voltage of each energy storage device 271 to the control unit 31. The control unit 31 determines the state of each energy storage device 271 based on the voltage value. For example, when determining that the energy storage device 271 is abnormal, the control unit 31 causes the current breaking unit 4 to break the current.

The battery management device 3 includes a current measurement unit 34. The current measurement unit 34 is connected to both ends of the shunt resistor 28. The current measurement unit 34 is connected to the shunt resistor 28 through a pair of signal wires 341,341 connected to both ends of the shunt resistor 28. The current measurement unit 34 includes differential analog-to-digital (AD) conversion units 342 and 343. The pair of signal wires 341,341 are connected to the differential AD conversion units 342 and 343, and convert a voltage between the pair of signal wires 341,341 into a digital signal. As a result, the current measurement unit 34 acquires the value of the voltage across the shunt resistor 28.

The current measurement unit 34 calculates the value of the current flowing through the shunt resistor 28 based on the voltage across the shunt resistor 28. For example, the current measurement unit 34 stores the resistance value of the shunt resistor 28 in advance, and calculates the current value by dividing the voltage value by the resistance value. In this manner, the voltage measurement unit 33 measures the value of the current flowing through the shunt resistor 28. The current measurement unit 34 calculates a current value using the digital signal of the voltage converted by each of the differential AD conversion units 342 and 343. That is, the current measurement unit 34 calculates a plurality of current values. The voltage measurement unit 33 is connected to the control unit 31, and inputs the measured current value to the control unit 31.

The control unit 31 determines the state of the energy storage device 271 based on the current value. For example, when determining that the energy storage device 271 is abnormal, the control unit 31 causes the current breaking unit 4 to break the current. Further, the control unit 31 integrates the current value. The control unit 31 may calculate an SOC of the energy storage device 271 based on the integrated value of the current. The control unit 31 may store the current value, the integrated value of the current, or the SOC in the memory 32. The battery management device 3 may include an output unit that outputs information indicating a state of the energy storage device 271 such as a current value or an SOC to the outside.

The current measurement unit 34 may input a plurality of measured current values to the control unit 31. The control unit 31 compares the plurality of current values to determine the state of the current measurement unit 34. For example, when the difference between the plurality of current values exceeds a predetermined value, the control unit 31 determines that the current measurement unit 34 is abnormal. Alternatively, the current measurement unit 34 may compare the plurality of current values to self-diagnose the state of the current measurement unit 34.

The battery management device 3 includes a temperature measurement unit 36. The temperature measurement unit 36 measures the temperature in the battery unit 27. For example, the temperature measurement unit 36 measures the temperature using a thermocouple or a thermistor. The temperature measurement unit 36 is connected to the control unit 31, and inputs the measured value of the temperature to the control unit 31. The control unit 31 determines the state of the energy storage device 271 based on the temperature value, and causes the current breaking unit 4 to break the current when determining that the energy storage device 271 is abnormal.

The battery management device 3 includes a potential difference detection unit 35. The potential difference detection unit 35 includes a differential amplifier circuit 351. A pair of input signal wires 354,354 connected to both ends of the shunt resistor 28 are connected to an input end of the differential amplifier circuit 351. The reference voltage of the differential amplifier circuit 351 is a potential increased from the ground potential using a voltage source 355 and an amplifier 353. A comparator 352 is connected to an output end of the differential amplifier circuit 351. The comparator 352 is connected to the control unit 31.

The differential amplifier circuit 351 amplifies and outputs a difference in potential between the pair of input signal wires 354,354, that is, a difference in potential between both ends of the shunt resistor 28. The comparator 352 compares the value of the potential difference output from the differential amplifier circuit 351 with a predetermined threshold. In this manner, the potential difference detection unit 35 detects the potential difference between both ends of the shunt resistor 28. When the value of the potential difference exceeds the threshold, the comparator 352 inputs a current breaking instruction to the control unit 31. When the current breaking instruction is input from the comparator 352, the control unit 31 causes the current breaking unit 4 to break the current. A process in response to the current breaking instruction from the comparator 352 is executed as an interrupt process. The comparator 352 may input the current breaking instruction to the control unit 31 when the value of the potential difference is equal to or larger than the threshold.

When the potential difference between both ends of the shunt resistor 28 is large, an overcurrent flows between both ends of the shunt resistor 28. For example, an overcurrent is generated due to a short circuit from the outside of the energy storage apparatus 1. That is, the potential difference detection unit 35 detects occurrence of an overcurrent and breaks the current. The potential difference detection unit 35 corresponds to an overcurrent detection unit. A process in which the control unit 31 causes the current breaking unit 4 to break the current when the overcurrent is detected corresponds to a breaking processing unit.

In the present embodiment, a pair of connecting wires 347,347 are connected to the pair of signal wires 341,341 connected to one differential AD conversion unit 343 included in the current measurement unit 34. Each connecting wire 347 connects the signal wire 341 and a ground 346 via a resistor 344 and an opening/closing switch 345. The ground 346 corresponds to a reference potential source. In a state where the opening/closing switch 345 is closed, the differential AD conversion unit 343 is connected to the ground 346 via the resistor 344. In a state where the opening/closing switch 345 is open, the differential AD conversion unit 343 is not connected to the ground 346. The open state of the opening/closing switch 345 is a normal state. The current measurement unit 34 can open and close the opening/closing switch 345. The resistor 344 is higher in resistance than the shunt resistor 28 such that the voltage drop by the resistor 344 is negligibly smaller than the voltage drop by the shunt resistor 28.

In the normal state of the energy storage apparatus 1, the pair of signal wires 341,341 are connected to each other via the shunt resistor 28. In the energy storage apparatus 1, a failure may occur in which the connection between the pair of signal wires 341,341 via the shunt resistor 28 becomes defective. For example, when a circuit between the external terminals 221,221 and the shunt resistor 28 are disconnected, the connection between the pair of signal wires 341,341 via the shunt resistor 28 becomes defective. For example, even when at least one of the pair of signal wires 341,341 comes down or the shunt resistor 28 is broken, the connection between the pair of signal wires 341,341 via the shunt resistor 28 becomes defective. In a state where the connection between the pair of signal wires 341,341 via the shunt resistor 28 is defective, the current measurement unit 34 cannot normally measure the current flowing through the shunt resistor 28. Therefore, the battery management device 3 cannot appropriately manage the energy storage device 271. For example, the battery management device 3 cannot correctly calculate the SOC of the energy storage device 271.

Figure 5:
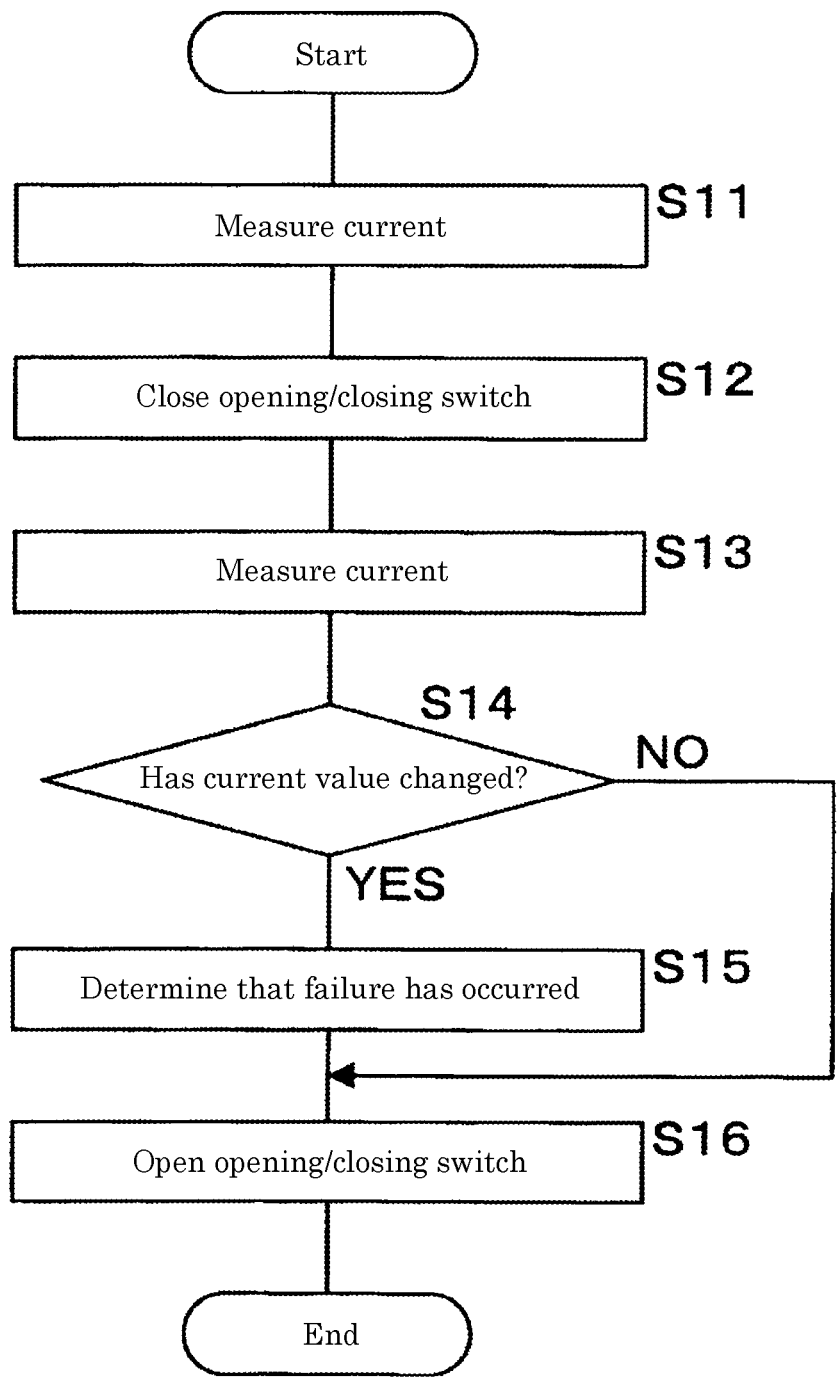
FIG. 5 is a flowchart illustrating a procedure of an example of a process of determining presence or absence of a failure performed by a battery management device.

The battery management device 3 performs a process of determining the presence or absence of a failure in which the connection between the pair of signal wires 341,341 via the shunt resistor 28 becomes defective. FIG. 5 is a flowchart illustrating a procedure of an example of the process of determining the presence or absence of a failure performed by the battery management device 3. Hereinafter, the step is abbreviated as S. In a state where the opening/closing switch 345 is open, the current measurement unit 34 measures the current (S11). In S11, the differential AD conversion unit 343 converts the voltage between the pair of signal wires 341,341 into a digital signal in a state where the opening/closing switch 345 is open. The current measurement unit 34 calculates a current value using the digital signal of the voltage converted by the differential AD conversion unit 343. The current measurement unit 34 inputs the current value to the control unit 31.

Next, the current measurement unit 34 closes the opening/closing switch 345 (S12). In a state where the opening/closing switch 345 is closed, the current measurement unit 34 measures the current (S13). In S13, the differential AD conversion unit 343 converts the voltage between the pair of signal wires 341,341 into a digital signal in a state where the opening/closing switch 345 is closed. The current measurement unit 34 calculates a current value using the digital signal of the voltage converted by the differential AD conversion unit 343. The current measurement unit 34 inputs the current value to the control unit 31. The control unit 31 compares the current value measured by the current measurement unit 34 in a state where the opening/closing switch 345 is opened with the current value measured by the current measurement unit 34 in a state where the opening/closing switch 345 is closed, and determines whether or not the current value has changed according to the opening/closing of the opening/closing switch 345 (S14).

In a state where a failure in which the connection between the pair of signal wires 341,341 via the shunt resistor 28 becomes defective has not occurred, when the opening/closing switch 345 is open, the voltage across the shunt resistor 28 is input to the differential AD conversion unit 343. When the opening/closing switch 345 is closed, since the resistor 344 has a higher resistance than the shunt resistor 28, the signal wire 341 is hardly affected by the ground 346 connected via the resistor 344. A voltage substantially equivalent to that when the opening/closing switch 345 is open is input to the differential AD conversion unit 343. In this state, the current value measured by the current measurement unit 34 is substantially the same between a case where the opening/closing switch 345 is open and a case where the opening/closing switch 345 is closed.

In a state where a failure has occurred, when the opening/closing switch 345 is open, the pair of signal wires 341,341 are not connected to each other and enter a high-impedance state. A high voltage is input to the differential AD conversion unit 343, and the current measurement unit 34 measures a high current value. When the opening/closing switch 345 is closed, the signal wire 341 is connected to the ground 346 through the connecting wire 347. The voltage between the pair of signal wires 341,341 becomes substantially 0, and a voltage of substantially 0 is input to the differential AD conversion unit 343. The current measurement unit 34 measures a current value of substantially 0. In this state, the current value measured by the current measurement unit 34 greatly changes between a case where the opening/closing switch 345 is open and a case where the opening/closing switch 345 is closed.

Figure 6:
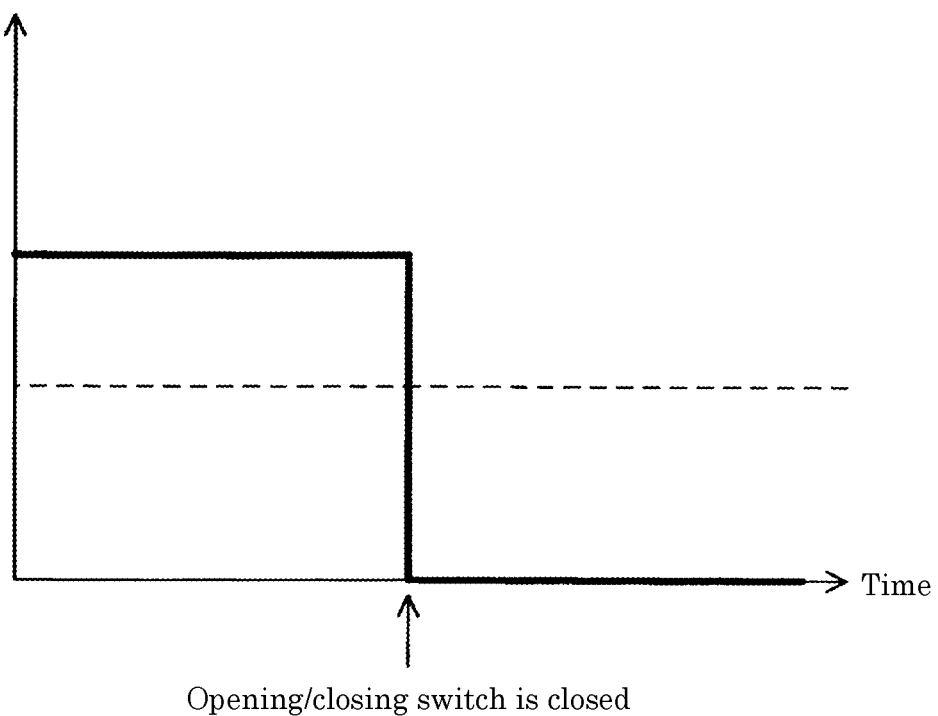
FIG. 6 is a graph schematically showing a change in a current value measured by a current measurement unit.

FIG. 6 is a graph schematically showing a change in a current value measured by the current measurement unit 34. In the graph, the horizontal axis represents time, and the vertical axis represents the current value. In the graph, a time point when the opening/closing switch 345 is closed from an open state is indicated by an arrow. The current value in a state where a failure has not occurred is indicated by a broken line, and the current value in a state where a failure has occurred is indicated by a solid line. In a state where a failure has not occurred, the current value is the same or a change in the current value is small before and after the opening/closing switch 345 is closed. In a state where a failure has occurred, the current value is high when the opening/closing switch 345 is open, and the current value approaches 0 when the opening/closing switch 345 is closed. The current value greatly changes before and after the opening/closing switch 345 is closed. Specifically, as compared with the current value when the opening/closing switch 345 is open, the current value when the opening/closing switch 345 is closed changes so as to approach 0. As described above, a change in current when the opening/closing switch 345 is opened and closed varies depending on whether or not a failure has occurred. Therefore, the battery management device 3 can determine whether or not a failure has occurred according to a difference in change in current when the opening/closing switch 345 is opened and closed.

In S14, the control unit 31 determines that the current value has changed when the absolute value of the difference between the current value in the state where the opening/closing switch 345 is open and the current value in the state where the opening/closing switch 345 is closed exceeds a predetermined threshold. Alternatively, the control unit 31 may determine that the current value has changed when the absolute value of the difference between the current values is equal to or larger than the threshold. Alternatively, the control unit 31 may determine that the current value has changed when the absolute value of the difference between the current values exceeds the threshold or is equal to or larger than the threshold and the change in the current value is a change approaching 0. Alternatively, the control unit 31 may determine that the current value has changed when the change in the current value is a change approaching 0 and the absolute value of the current in the state where the opening/closing switch 345 is closed is equal to or smaller than a predetermined upper limit value.

When the current value has changed (S14: YES), the control unit 31 determines that a failure has occurred (S15). The processes of S14 and S15 correspond to a determination unit. After S15 ends, or when there is no change in the current value (S14: NO), the current measurement unit 34 opens the opening/closing switch 345 (S16), and the battery management device 3 ends the process of determining the presence or absence of a failure.

The control unit 31 may determine that a failure has not occurred when there is no change in the current value. When determining that a failure has occurred, the control unit 31 may cause the current breaking unit 4 to break the current, or may stop the process of managing the energy storage device 271 based on the current value. For example, the control unit 31 stops the process of calculating the SOC of the energy storage device 271 based on the current value.

For example, the control unit 31 stops recording or deletes recording of a current value that has become an incorrect value due to a failure or an SOC. In a mode in which the battery management device 3 includes an output unit, when determining that a failure has occurred, the control unit 31 may cause the output unit to output information indicating the occurrence of the failure. For example, the moving body 100 may include a display unit, the battery management device 3 may output information indicating the occurrence of the failure from the output unit to the display unit of the moving body 100, and the display unit may display an image indicating the occurrence of the failure. Further, for example, the battery management device 3 may output information indicating the occurrence of the failure to a device outside the energy storage apparatus 1 or outside the moving body 100, such as a smartphone, from the output unit or through a communication unit in the moving body 100 connected to the output unit.

The battery management device 3 periodically executes the processes of S11 to S16. At this time, the current measurement unit 34 corresponds to a first opening/closing unit. For example, the battery management device 3 executes the processes of S11 to S16 once per minute. By periodically determining the presence or absence of a failure, the battery management device 3 can reliably determine the occurrence of a failure. The processes of S14 and S15 are executed by the control unit 31 according to the computer program 321. The processes of S11 to S13 and S16 may be executed by the control unit 31 controlling the current measurement unit 34 according to the computer program 321.

Figure 7:
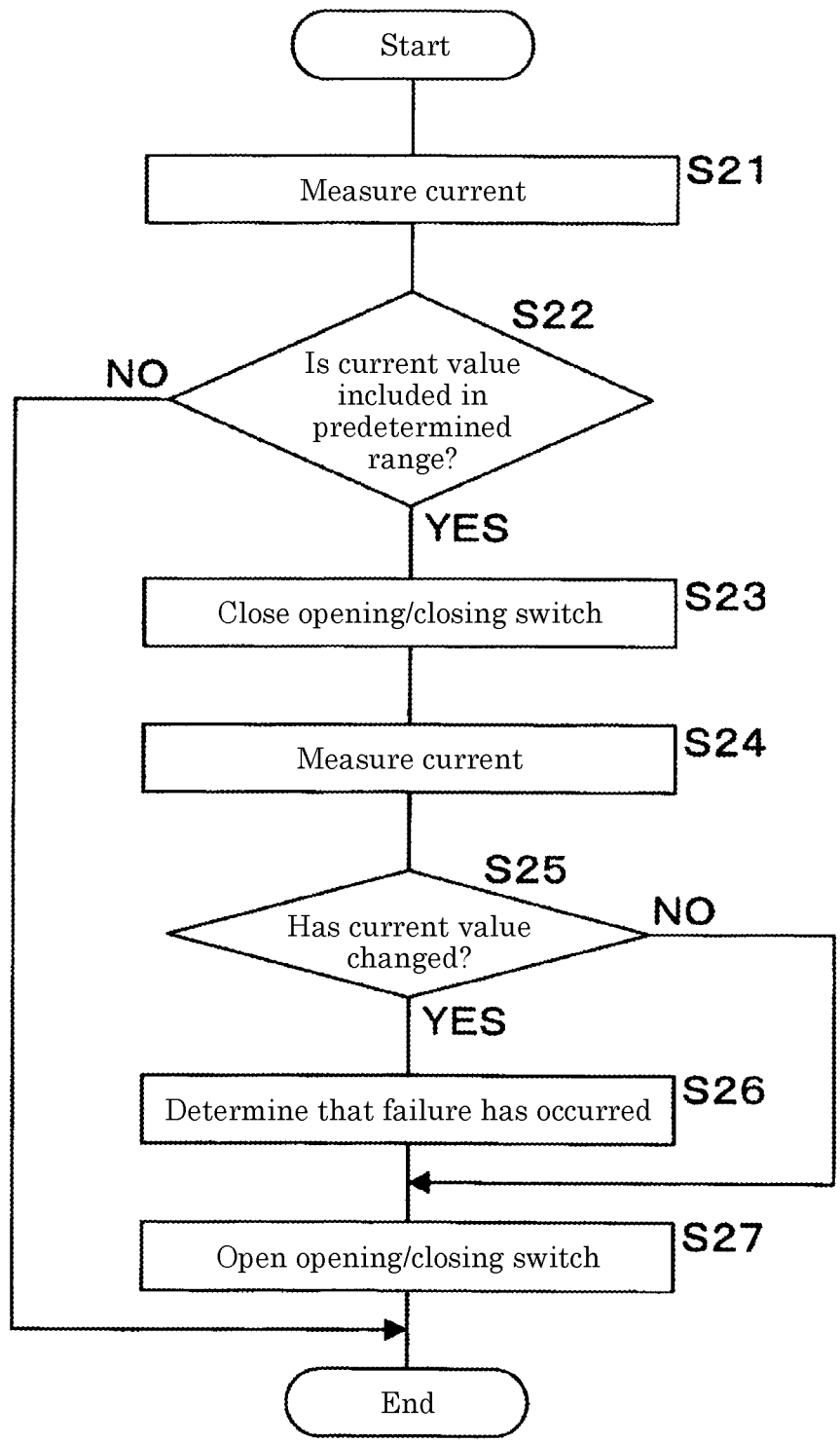
FIG. 7 is a flowchart illustrating a procedure of another example of the process of determining the presence or absence of a failure performed by the battery management device.

FIG. 7 is a flowchart illustrating a procedure of another example of the process of determining the presence or absence of a failure performed by the battery management device 3. In a state where the opening/closing switch 345 is open, the current measurement unit 34 measures the current (S21). The current measurement unit 34 inputs the current value to the control unit 31. The control unit 31 determines whether or not the current value is included in a predetermined range that is a value higher than usual (S22). For example, a value equal to or larger than a predetermined lower limit value is set as a value included in the predetermined range. For example, the control unit 31 determines that the current value is included in the predetermined range when the current value is equal to or larger than 50 A. When the current value is not included in the predetermined range (S22: NO), the control unit 31 ends the process of determining the presence or absence of a failure.

When the current value is included in the predetermined range (S22: YES), the control unit 31 instructs the current measurement unit 34 to close the opening/closing switch 345, and the current measurement unit 34 closes the opening/closing switch 345 (S23). In a state where the opening/closing switch 345 is closed, the current measurement unit 34 measures the current (S24). The control unit 31 determines whether or not the current value has changed according to the opening and closing of the opening/closing switch 345 (S25). When the current value has changed (S25: YES), the control unit 31 determines that a failure has occurred (S26). The processes of S25 and S26 correspond to the determination unit. After S26 ends, or when there is no change in the current value (S25: NO), the current measurement unit 34 opens the opening/closing switch 345 (S27), and the battery management device 3 ends the process of determining the presence or absence of a failure. When determining that a failure has occurred, the control unit 31 may perform a specific process such as causing the output unit to output information indicating the occurrence of the failure.

The control unit 31 may determine that a failure has not occurred when there is no change in the current value. The battery management device 3 periodically executes the processes of S21 to S27. For example, the battery management device 3 executes the processes of S21 to S27 once per minute. The processes of S22, S25, and S26 are executed by the control unit 31 according to the computer program 321. The processes of S21, S23, S24, and S27 may be executed by the control unit 31 controlling the current measurement unit 34 according to the computer program 321. When the battery management device 3 executes the processes of S21 to S27, the current measurement unit 34 corresponds to a second opening/closing unit.

As described above, in a state where a failure has occurred, the current measurement unit 34 measures a high current value. In the processes of S21 to S27, the battery management device 3 makes a determination when the current value is included in the predetermined range that is a value higher than usual and there is a high possibility that a failure has occurred. The battery management device 3 makes a determination when there is a high possibility that a failure has occurred, and can determine the occurrence of a failure with high accuracy.

As described above in detail, in the present embodiment, the battery management device 3 connects the ground 346 to the signal wire 341 via the opening/closing switch 345. A change in current when the opening/closing switch 345 is opened and closed is different between a state where there is a failure in which the connection between the pair of signal wires 341,341 via the shunt resistor 28 becomes defective and a state where there is no failure. The battery management device 3 can determine the presence or absence of a failure based on the change in current when the opening/closing switch 345 is opened and closed. Since the change in current when the opening/closing switch 345 is opened and closed is clearly different depending on the presence or absence of a failure, the battery management device 3 can determine the presence or absence of a failure in a short time as compared with the case of determining the presence or absence of a failure from the change in time of the current. When a failure occurs in which the connection between the pair of signal wires 341,341 via the shunt resistor 28 becomes defective, the current flowing through the shunt resistor 28 cannot be correctly measured by the current measurement unit 34. That is, the battery management device 3 can easily determine the presence or absence of a failure that causes current measurement not to be normally performed in a short time. For example, even when a failure occurs in which the battery management device 3 and the shunt resistor 28 are disconnected, the battery management device 3 can easily determine the occurrence of a failure.

The battery management device 3 can stop the process based on the incorrect current value caused by the failure in a short time, and reduce the influence of the incorrect current value being measured. In the battery management device 3, the connecting wires 347, the resistors 344, and the opening/closing switches 345 are added as compared with the conventional battery management device. The number of added components is small, and the increase in cost is small as compared with the conventional battery management device.

By determining the presence or absence of a failure in a short time, the battery management device 3 determines the presence or absence of a failure before performing the process of detecting an overcurrent and breaking the current using the potential difference detection unit 35.

Since the change in current when the opening/closing switch 345 is opened and closed is clearly different depending on the presence or absence of a failure, the battery management device 3 can determine the presence or absence of a failure in a short time as compared with the case of detecting the change of the current flowing through the shunt resistor 28 to the overcurrent due to the failure. Therefore, the battery management device 3 can stop the process based on the incorrect current value caused by the failure before breaking the current in response to the detection of the overcurrent. For example, the battery management device 3 performs the process of stopping the calculation of the SOC of the energy storage device 271 based on the current value before the current is broken.

Since the calculation of the SOC based on the current value is performed by integrating the current value, it is desirable not to use the incorrect current value in order to accurately calculate the SOC. When the incorrect current value is measured due to the failure, the battery management device 3 can determine the occurrence of the failure in a short time and quickly stop the calculation of the SOC using the incorrect current value. Therefore, the battery management device 3 can more accurately calculate the SOC of the energy storage device 271 based on the current value.

In general, there is a correlation between the SOC of the energy storage device and the open-circuit voltage, and the SOC can be estimated from the open-circuit voltage. However, in the iron-based lithium ion battery, the open-circuit voltage corresponding to many values of the SOC is substantially constant, and it is difficult to estimate the SOC from the open-circuit voltage. Therefore, in the iron-based lithium ion battery, it is necessary to calculate the SOC based on the current value in order to obtain the SOC. Since the battery management device 3 can accurately calculate the SOC of the energy storage device 271 based on the current value, an accurate SOC can be obtained even when the energy storage device 271 is a cell of the iron-based lithium ion battery.

In the present embodiment, the energy storage apparatus 1 is provided in the moving body 100 in order to start the engine 10. The energy storage apparatus 1 can supply a large current in order to start the engine 10. The moving body 100 is a four-wheeled automobile, and a large current is required to start the engine 10 of the four-wheeled automobile. In order to measure a large current by the battery management device 3, it is necessary to use the shunt resistor 28 having a low resistance. The shunt resistor 28 having a low resistance may be large and heavy. When vibration is applied to the energy storage apparatus 1 and vibration is applied to the heavy shunt resistor 28 along with the movement of the moving body 100, stress applied to a portion where the shunt resistor 28 is fixed increases, and the shunt resistor 28 may be disconnected from the battery management device 3. When the shunt resistor 28 is disconnected, the battery management device 3 can determine the disconnection of the shunt resistor 28, and can appropriately diagnose the failure of the energy storage apparatus 1. In particular, regarding the energy storage apparatus 1 provided in the four-wheeled automobile, the battery management device 3 can reliably determine the disconnection of the shunt resistor 28 and can appropriately diagnose the failure.

Second Embodiment

Figure 8:
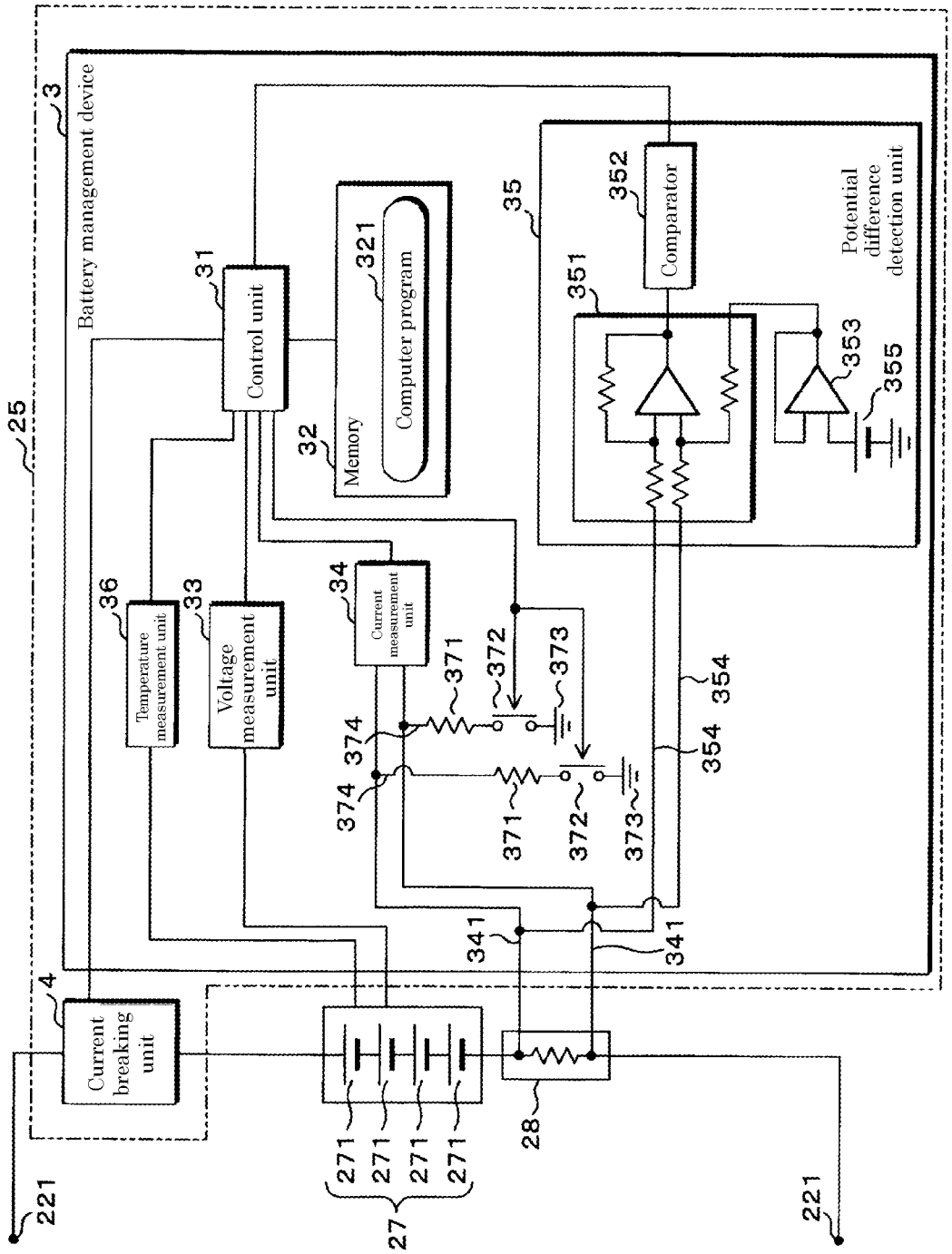
FIG. 8 is a block diagram illustrating an electrical configuration example of an energy storage apparatus according to the second embodiment.

FIG. 8 is a block diagram illustrating an electrical configuration example of an energy storage apparatus 1 according to the second embodiment. The current measurement unit 34 is connected to the shunt resistor 28 through a pair of signal wires 341,341 connected to both ends of the shunt resistor 28. The current measurement unit 34 includes a differential AD conversion unit that converts the voltage between the pair of signal wires 341,341 into a digital signal, acquires the value of the voltage across the shunt resistor 28, and calculates the value of the current flowing through the shunt resistor 28.

A pair of connecting wires 374,374 are connected to the pair of signal wires 341,341 outside the current measurement unit 34. Each connecting wire 374 connects the signal wire 341 and a ground 373 via a resistor 371 and an opening/closing switch 372. The ground 373 corresponds to a reference potential source. In a state where the opening/closing switch 372 is closed, the current measurement unit 34 is connected to the ground 373 via the resistor 371. In a state where the opening/closing switch 372 is open, the current measurement unit 34 is not connected to the ground 373. The opening/closing of the opening/closing switch 372 is controlled by the control unit 31. The open state of the opening/closing switch 372 is a normal state. The resistor 371 is higher in resistance than the shunt resistor 28 such that the voltage drop by the resistor 371 is negligibly smaller than the voltage drop by the shunt resistor 28. Configurations of other portions of the battery management device 3 are similar to those of the first embodiment. Configurations of portions of the energy storage apparatus 1 and the moving body 100 other than the battery management device 3 are similar to those of the first embodiment.

Also in the second embodiment, the battery management device 3 performs a process of determining the presence or absence of a failure in which the connection between the pair of signal wires 341,341 via the shunt resistor 28 becomes defective. The battery management device 3 determines the presence or absence of a failure by a process similar to the process illustrated in the flowchart of FIG. 5. In a state where the opening/closing switch 372 is open, the current measurement unit 34 measures the current (S11). Next, the control unit 31 closes the opening/closing switch 372 (S12). In a state where the opening/closing switch 372 is closed, the current measurement unit 34 measures the current (S13). The control unit 31 compares the current value measured by the current measurement unit 34 in a state where the opening/closing switch 372 is open with the current value measured by the current measurement unit 34 in a state where the opening/closing switch 372 is closed, and determines whether or not the current value has changed according to the opening/closing of the opening/closing switch 372 (S14).

In a state where a failure in which the connection between the pair of signal wires 341,341 via the shunt resistor 28 becomes defective has not occurred, when the opening/closing switch 372 is closed, since the resistor 371 has a high resistance, the signal wire 341 is hardly affected by the ground 373. The current value measured by the current measurement unit 34 is substantially the same between a case where the opening/closing switch 372 is open and a case where the opening/closing switch 372 is closed. In a state where a failure has occurred, when the opening/closing switch 372 is closed, the signal wire 341 is connected to the ground 373 through the connecting wire 374, and the current measurement unit 34 measures a current value of substantially 0. The current value measured by the current measurement unit 34 greatly changes between a case where the opening/closing switch 372 is open and a case where the opening/closing switch 372 is closed.

When the current value has changed (S14: YES), the control unit 31 determines that a failure has occurred (S15). After S15 ends, or when there is no change in the current value (S14: NO), the control unit 31 opens the opening/closing switch 372 (S16), and ends the process of determining the presence or absence of a failure. When determining that a failure has occurred, the control unit 31 may perform a specific process such as causing the output unit to output information indicating the occurrence of the failure. The battery management device 3 periodically executes the processes of S11 to S16. The processes of S12 and S14 to S16 are executed by the control unit 31 according to the computer program 321. At this time, the control unit 31 corresponds to the first opening/closing unit. The processes of S11 and S13 may be executed by the control unit 31 controlling the current measurement unit 34 according to the computer program 321.

Alternatively, the battery management device 3 may determine the presence or absence of a failure by a process similar to the process illustrated in the flowchart of FIG. 7. In a state where the opening/closing switch 372 is open, the current measurement unit 34 measures the current (S21). The control unit 31 determines whether or not the current value is included in a predetermined range that is a value higher than usual (S22). When the current value is not included in the predetermined range (S22: NO), the control unit 31 ends the process of determining the presence or absence of a failure.

When the current value is included in the predetermined range (S22: YES), the control unit 31 closes the opening/closing switch 372 (S23). In a state where the opening/closing switch 372 is closed, the current measurement unit 34 measures the current (S24). The control unit 31 determines whether or not the current value has changed according to the opening and closing of the opening/closing switch 372 (S25). When the current value has changed (S25: YES), the control unit 31 determines that a failure has occurred (S26). After S26 ends, or when there is no change in the current value (S25: NO), the control unit 31 opens the opening/closing switch 372 (S27), and ends the process of determining the presence or absence of a failure. When determining that a failure has occurred, the control unit 31 may perform a specific process such as causing the output unit to output information indicating the occurrence of the failure.

The battery management device 3 periodically executes the processes of S21 to S27. The processes of S22, S23, and S25 to S27 are executed by the control unit 31 according to the computer program 321. The processes of S21 and S24 may be executed by the control unit 31 controlling the current measurement unit 34 according to the computer program 321. When the battery management device 3 executes the processes of S21 to S27, the control unit 31 corresponds to the second opening/closing unit.

Also in the present embodiment, the battery management device 3 can determine the presence or absence of a failure in which the connection between the pair of signal wires 341,341 via the shunt resistor 28 becomes defective based on a change in current when the opening/closing switch 372 is opened and closed. That is, the battery management device 3 can easily determine the presence or absence of a failure that causes current measurement not to be normally performed in a short time. In the battery management device 3, the connecting wires 374, the resistors 371, and the opening/closing switches 372 are added as compared with the conventional battery management device. The number of added components is small, and the increase in cost is small as compared with the conventional battery management device.

In the first and second embodiments, the example in which the reference potential source is the ground has been described. Alternatively, the reference potential source may be other than the ground. In the first and second embodiments, the mode in which the current breaking unit 4 exists outside the battery management device 3 has been described. Alternatively, the battery management device 3 may include the current breaking unit 4 therein. In the first and second embodiments, the mode in which the shunt resistor 28 exists outside the battery management device 3 has been described. Alternatively, the battery management device 3 may include the shunt resistor 28 therein. In the first and second embodiments, the example in which the moving body 100 is a four-wheeled automobile and the energy storage apparatus 1 is used to start the engine 10 has been described. Alternatively, the energy storage apparatus 1 may be used for applications other than starting the engine 10, such as supplying electric power for driving various devices in the moving body 100. The energy storage apparatus 1 may be provided in a moving body other than a four-wheeled automobile. The energy storage apparatus 1 may be used for applications other than the moving body.

The present invention is not limited to the contents of the above-described embodiments, and various modifications can be made within the scope indicated in the claims. That is, embodiments obtained by combining technical means appropriately changed within the scope indicated in the claims are also included in the technical scope of the present invention.

DESCRIPTION OF REFERENCE SIGNS

1: energy storage apparatus
10: engine
100: moving body
221: external terminal
25: control board
27: battery unit
271: energy storage device
28: shunt resistor
3: battery management device
31: control unit
32: memory
321: computer program
34: current measurement unit
341: signal wire
342, 343: differential AD conversion unit
344, 371: resistor
345, 372: opening/closing switch
346, 373: ground
347, 374: connecting wire
35: potential difference detection unit
4: current breaking unit

The invention claimed is:

1. A battery management device that manages an energy storage device to which a shunt resistor is connected, the battery management device comprising:
a current measurement unit that measures a current flowing through the shunt resistor using a pair of signal wires connected to both ends of the shunt resistor;
a connecting wire that connects the signal wire to a reference potential source via an opening/closing switch; and
a determination unit that determines presence or absence of a failure in which connection between the pair of signal wires via the shunt resistor becomes defective based on a change in current measured by the current measurement unit when the opening/closing switch is opened and closed,
wherein the reference potential source is a ground,
wherein the current measurement unit measures a voltage between the pair of signal wires and measures a current based on the voltage,
wherein the pair of connecting wires are connected to the pair of signal wires via a resistor having a resistance higher than a resistance of the shunt resistor, and
wherein the determination unit determines that the failure has occurred when a current measured by the current measurement unit approaches 0 in a state where the opening/closing switch is closed as compared with a current measured by the current measurement unit in a state where the opening/closing switch is open.

2. The battery management device according to claim 1, further comprising a first opening/closing unit that periodically opens and closes the opening/closing switch.

3. The battery management device according to claim 1, further comprising a second opening/closing unit that opens and closes the opening/closing switch when a value of the current measured by the current measurement unit is included in a predetermined range.

4. The battery management device according to claim 1, further comprising:
an overcurrent detection unit that detects an overcurrent flowing through the shunt resistor; and
a breaking processing unit that performs a process for breaking the current flowing through the shunt resistor when the overcurrent is detected,
wherein the determination unit determines the presence or absence of the failure before the breaking processing unit performs the process.

5. An energy storage apparatus comprising: an energy storage device; a shunt resistor connected to the energy storage device; and a battery management device that manages the energy storage device,
wherein the battery management device includes:
a current measurement unit that measures a current flowing through the shunt resistor using a pair of signal wires connected to both ends of the shunt resistor;
a connecting wire that connects the signal wire to a reference potential source via an opening/closing switch; and
a determination unit that determines presence or absence of a failure in which connection between the pair of signal wires via the shunt resistor becomes defective based on a change in current measured by the current measurement unit when the opening/closing switch is opened and closed.

6. The energy storage apparatus according to claim 5, wherein the energy storage device is a lithium ion battery containing lithium iron phosphate in an electrode.

7. The energy storage apparatus according to claim 5, wherein the energy storage device supplies a current for starting an engine of a moving body.

8. The energy storage apparatus according to claim 7, wherein the moving body is a four-wheeled automobile.

9. A battery management method for managing an energy storage device to which a shunt resistor is connected, the battery management method comprising determining, using a current measurement unit that measures a current flowing through the shunt resistor using a pair of signal wires connected to both ends of the shunt resistor, and a connecting wire that connects the signal wire to a reference potential source via an opening/closing switch, presence or absence of a failure in which connection between the pair of signal wires via the shunt resistor becomes defective based on a change in current measured by the current measurement unit when the opening/closing switch is opened and closed.

10. A computer program that causes a computer to execute a process for managing an energy storage device using a current measurement unit that measures a current flowing through the shunt resistor using a pair of signal wires connected to both ends of the shunt resistor connected to the energy storage device, and a connecting wire that connects the signal wire to a reference potential source via an opening/closing switch, wherein the computer program causes the computer to execute:

opening and closing the opening/closing switch; and determining presence or absence of a failure in which connection between the pair of signal wires via the shunt resistor becomes defective based on a change in current measured by the current measurement unit when the opening/closing switch is opened and closed.

* * * * *